United States Patent
Kürten et al.

(10) Patent No.: US 12,520,438 B2
(45) Date of Patent: Jan. 6, 2026

(54) HOUSING AND ELECTRICAL APPLIANCE

(71) Applicant: SIEMENS AKTIENGESELLSCHAFT, Munich (DE)

(72) Inventors: Bernd Kürten, Obermichelbach (DE); Stefan Pfefferlein, Heroldsberg (DE)

(73) Assignee: Siemens Aktiengesellschaft, Munich (DE)

( * ) Notice: Subject to any disclaimer, the term of this patent is extended or adjusted under 35 U.S.C. 154(b) by 146 days.

(21) Appl. No.: 18/023,343

(22) PCT Filed: Jul. 28, 2021

(86) PCT No.: PCT/EP2021/071119
§ 371 (c)(1),
(2) Date: Feb. 24, 2023

(87) PCT Pub. No.: WO2022/042984
PCT Pub. Date: Mar. 3, 2022

(65) Prior Publication Data
US 2023/0337374 A1 Oct. 19, 2023

(30) Foreign Application Priority Data
Aug. 31, 2020 (EP) .................................... 20193570

(51) Int. Cl.
H05K 5/02 (2006.01)
G01K 1/14 (2021.01)
G01K 1/16 (2006.01)

(52) U.S. Cl.
CPC ................. *H05K 5/02* (2013.01); *G01K 1/14* (2013.01); *G01K 1/16* (2013.01)

(58) Field of Classification Search
CPC ...... H05K 5/0017; H05K 5/0217; H05K 5/02; G01K 1/14; G01K 1/16
(Continued)

(56) References Cited

U.S. PATENT DOCUMENTS

2008/0212647 A1* 9/2008 Barkic ...................... G01K 1/16
374/208
2012/0031517 A1* 2/2012 Yoshida ................. G01K 13/02
374/185
(Continued)

FOREIGN PATENT DOCUMENTS

CN 201034750 Y * 3/2008 ............. G01K 13/12
CN 107851355 A 3/2018
(Continued)

OTHER PUBLICATIONS

PCT International Search Report and Written Opinion of International Searching Authority mailed Nov. 5, 2021 corresponding to PCT International Application No. PCT/EP2021/071119.

*Primary Examiner* — Hung S. Bui
(74) *Attorney, Agent, or Firm* — Lempia Summerfield Katz LLC

(57) ABSTRACT

The invention relates to a housing (1) for an electrical appliance (20) comprising a housing body (2) which at least partially houses an electrical component (3) of the electrical appliance (20), the housing body (2) having at least one support point (4) for being supported on a plate (5) to which the electrical component (3) is connected, the housing (1) also having at least one temperature sensor (6) for sensing the temperature of the plate (5), each temperature sensor (6) being arranged in the housing body (2) in the region of a support point (4). The invention also relates to an electrical appliance (20) comprising at least one electrical component (3), at least one plate (5), which is connected in each case to the electrical component (3), and at least one housing (1) of the aforementioned kind, the housing body (2) being supported at the support point (4) on the plate (5). In order to provide, amongst other things, an improved electrical appliance (20), it is proposed that the housing body (2) has, in
(Continued)

each case, a single-pole electrical line (9) to the temperature sensor (6).

19 Claims, 3 Drawing Sheets

(58) Field of Classification Search
USPC .......................................................... 361/807
See application file for complete search history.

(56) References Cited

U.S. PATENT DOCUMENTS

| | | |
|---|---|---|
| 2012/0071870 A1 | 3/2012 | Salahieh et al. |
| 2012/0237402 A1 | 9/2012 | Cantarelli et al. |
| 2020/0098667 A1 | 3/2020 | Adachi |
| 2021/0014970 A1* | 1/2021 | Ha ..................... H01L 25/0657 |

FOREIGN PATENT DOCUMENTS

| | | | |
|---|---|---|---|
| CN | 111247406 A * | 6/2020 | ............. B60K 15/03 |
| EP | 3385688 A1 | 10/2018 | |
| JP | 2003197161 A * | 7/2003 | ............. H01M 2/04 |
| JP | 2006237276 A * | 9/2006 | ............... H05K 1/14 |
| JP | 2016206024 A | 12/2016 | |
| KR | 20190139653 A * | 12/2019 | ........... H05K 9/0024 |
| WO | 2017050307 A1 | 3/2017 | |
| WO | 2020170000 A1 | 8/2020 | |

\* cited by examiner

HOUSING AND ELECTRICAL APPLIANCE

This application is the National Stage of International Application No. PCT/EP2021/071119, filed Jul. 28, 2021, which claims the benefit of European Patent Application No. EP 20193570.7, filed Aug. 31, 2020. The entire contents of these documents are hereby incorporated herein by reference.

BACKGROUND

The present embodiments relate to a housing for an electrical appliance, and an electrical appliance including at least one electrical component and at least one housing of this kind.

Electrical appliances are used in numerous applications in electronics and power electronics.

In applications with power electronics, there is often a requirement for temperature information on the components or component parts. For this purpose, a temperature sensor is placed in the vicinity of the components or component parts in order, for example, to calculate the temperature of the components or component parts using a model with reference to the temperature information from the temperature sensor.

To date, the temperature sensors have either been placed on the heat sink and thus relatively far away from the components or component parts, which has the disadvantage of being quite inaccurate, or inside the module (e.g., power module with power semiconductors), on a circuit carrier present there. The latter has the disadvantage that the temperature sensor is not reliably electrically insulated from the rest of the electronics, and this may have to be achieved by other devices, such as optocouplers. In addition, the temperature sensor takes up valuable space on the circuit carrier.

US 2020/098667 A1 discloses a semiconductor module including a terminal case made of a resin for housing a semiconductor chip, and a cooling portion. The cooling portion includes a refrigerant circulating portion through which a refrigerant flows, and a joining portion surrounding the refrigerant circulating portion. The refrigerant circulating portion is arranged below the terminal case, and the cooling portion is arranged directly or indirectly in close contact with the terminal case at the joining portion. The terminal case is provided above the joining portion and has a side wall so as to surround the semiconductor chip when seen in a top view. A temperature sensor for sensing a temperature of the refrigerant is provided on the side wall.

SUMMARY AND DESCRIPTION

The scope of the present disclosure is defined solely by the appended claims and is not affected to any degree by the statements within this description.

The present embodiments may obviate one or more of the drawbacks or limitations in the related art. For example, an improved electrical appliance that, for example, overcomes the aforementioned disadvantages is provided.

In one embodiment, a housing has a housing body that in each case has a single-pole electrical line to a respective temperature sensor.

As another example, an electrical appliance including the housing is provided.

The housing has a housing body that may, for example, have a shape of a hood or a bracket and herein, for example, have a U-shaped cross section. The housing body may also be tubular in shape and herein have a rectangular cross section. The housing body optionally only has one opening, such as, for example, a vessel.

The housing body herein has at least one support point for being supported on the respective plate to which the respective electrical component is connected. For example, the respective electrical component is arranged on the respective plate. In the example of a hood-shaped or bracket-shaped embodiment of the housing, the respective support point is, for example, located where the hood or the bracket touches the respective plate.

The housing body is configured such that the housing body at least partially houses the respective electrical component. For example, the housing body is configured as a cover or hood that at least partially covers the respective electrical component. The housing body may also be configured as a housing frame. For example, the housing body and the respective plate completely enclose the respective electrical component, at least in a plane that penetrates the respective electrical component, the housing body, and the respective plate. As mentioned, the housing body may also be configured as a vessel into which the respective electrical component is inserted so that the respective electrical component is largely enclosed through the housing body, possibly together with the respective plate.

Further, the housing has at least one temperature sensor with which in each case the temperature of the respective plate may be ascertained or measured. In one embodiment, the respective temperature sensor is hence in thermal contact with the respective plate. The respective temperature sensor may, for example, be configured as a Peltier element or as a thermistor or a negative temperature coefficient (NTC) resistor.

Further, the respective temperature sensor in the housing body is arranged in the region of the respective support point. For the example of a bracket-shaped or U-shaped housing body, the arrangement of the respective temperature sensor in the housing body provides that the respective temperature sensor is integrated in one of the two arms of the bracket or the U-shape. More generally, the arrangement of the respective temperature sensor in the housing body may, for example, be that the housing body has a geometric shape with walls or struts, and the respective temperature sensor is accommodated in one of the walls or struts of the housing body or integrated into one of the walls or struts.

The arrangement of the respective temperature sensor in the region of the respective support point may, for example, be achieved in that the respective temperature sensor directly touches the respective support point or the respective plate or is arranged directly adjacent thereto. Further, such an arrangement may also be achieved in that the respective temperature sensor is arranged in the vicinity of the respective support point. This may, for example, be the case if the housing body has a size in the range of centimeters or decimeters and the respective temperature sensor has a distance to the respective support point in the range of millimeters (e.g., a few millimeters, a few tenths or hundredths of a millimeter).

The arrangement of the respective temperature sensor on or close to the respective support point and hence on or close to the respective plate may achieve a more precise determination of the temperature of the respective plate and thus of the respective electrical component. This is important in order to avoid overheating of the respective electrical component and may hence extend the service life of the respective electrical component and hence of the electrical appliance.

Depending upon the embodiment of the respective temperature sensor and the region between the respective temperature sensor and the respective plate, it is also possible to achieve reliable electrical separation or insulation of the respective temperature sensor from the rest of the electronics of the electrical appliance in a comparatively simple way.

The housing body in each case has a single-pole electrical line to the respective temperature sensor. This provides, for example, that the respective temperature sensor has a first terminal line implemented by the respective single-pole electrical line. In one embodiment, the respective temperature sensor is in electrical contact with the respective plate so that the second terminal line is implemented via the respective plate (and possibly a grounding or other line connected to the respective plate). The first terminal line and the second terminal line may herein together form a signal line of the respective temperature sensor. The respective temperature sensor may herein directly touch the respective plate or an electrically conductive material (e.g., a solder or the like may be arranged between the respective temperature sensor and the respective plate). This electrically conductive material may, at the same time, be a good heat conductor (e.g., a material with a thermal conductivity of at least 40 W/(m·K), greater than 200 W/(m·K), or greater than 400 W/(m·K)).

This embodiment may be used with electrical appliances in which no electrical separation or insulation of the respective temperature sensor from the respective plate or the respective electrical component is required. An advantage of this embodiment is that the respective temperature sensor is arranged both in a space-saving manner and very close to or in direct thermal contact on or with the respective plate or the respective electrical component. The latter aspect makes it possible to achieve comparatively accurate temperature sensing for the respective plate or the respective electrical component.

In an embodiment, the housing body has an electrically insulating material (e.g., at least in the region of the respective support point).

Herein, materials considered to be electrically insulating materials are those with an electrical conductivity σ of less than $10^{-8}$ S/m (e.g., in the order of $10^{-16}$ S/m) at room temperature. For example, the housing body consists entirely of an electrically insulating material (e.g., a plastic or an electrically insulating ceramic). For example, the respective temperature sensor may be encapsulated by plastic (e.g., a thermoplastic) that forms the housing body. Optionally, it may also be possible to use a housing body that has the electrically insulating material at least in the region of the respective support point and possibly additionally in the region of the respective temperature sensor. With this option, the housing body may also have partially electrically conductive materials (e.g., steel).

The fact that the housing body has an electrically insulating material makes it comparatively easy to achieve electrical separation or insulation of the respective temperature sensor from the rest of the electronics of the electrical appliance.

In a further embodiment, the respective temperature sensor is arranged in a respective cavity of the housing body. The respective cavity is hence integrated into the housing body and may, for example, be configured as a type of shaft. The respective cavity or shaft may herein be open toward the side of the respective support point or toward the opposite side so that, although the respective cavity or shaft is open, the respective cavity is closed toward the respective supporting surface. For example, if the housing body has walls or struts, the respective cavity may be arranged in one of the walls or struts. This provides that the respective cavity is completely or at least to a large extent enclosed by the respective wall or the respective struts. Accordingly, the respective cavity may be closed or, for example, have an opening facing the respective plate. The respective temperature sensor may, for example, be inserted or glued into the respective cavity.

Such an embodiment of the housing body enables both space-saving accommodation of the respective temperature sensor and an arrangement of the respective temperature sensor on or close to the respective plate or the respective electrical component. For example, if the respective cavity is open toward the respective plate, a material with good thermal conductivity, such as, for example, a heat-transfer compound, a corresponding adhesive or plastic, may be arranged between the respective temperature sensor and the support point or the respective plate. This material with good thermal conductivity may herein be electrically insulating, such as, for example, corresponding ceramics or material filled with a corresponding ceramic, mica or heat-conducting pads. Herein, a good heat conductor is considered to be material with a thermal conductivity of at least 40 W/(m·K) (e.g., greater than 200 W/(m·K) or 400 W/(m·K)).

In a further embodiment, the housing body herein has at least two projections in the respective cavity for fixing the respective temperature sensor. The projections position and fix the respective temperature sensor inside the housing body. At the same time, thermal decoupling from the housing body may be achieved, which increases the accuracy of the temperature detection of the respective plate and hence of the respective electrical component.

Alternatively or additionally, the housing body may have a material with comparatively poor thermal conductivity (e.g., in the region around the respective temperature sensor), but not between the respective temperature sensor and the respective support point. Herein, materials are considered to have comparatively poor thermal conductivity if the materials have a thermal conductivity of less than 0.5 W/(m·K) (e.g., less than 0.2 W/(m·K)) at room temperature.

In an alternative embodiment, the respective temperature sensor is completely enclosed by the housing body. This may, for example, be achieved in that the respective temperature sensor is encapsulated in a plastic that forms the housing body. In one embodiment, the housing body has an electrically insulating material (e.g., in the region of the respective support point). As a result of this, it is possible to achieve reliable electrical separation or insulation of the respective temperature sensor from the respective plate or the respective electrical component.

In one embodiment, the housing body has only a small thickness between the respective temperature sensor and the support point. This may, for example, be the case if the size of the housing body is in the range of centimeters or decimeters and the distance of the respective temperature sensor from the respective support point is in the range of millimeters (e.g., a few millimeters, a few tenths or hundredths of a millimeter).

Alternatively or additionally, a material with good thermal conductivity, such as, for example, a heat-transfer compound, a corresponding adhesive, or plastic may be arranged between the respective temperature sensor and the support point or the respective plate. This material with good thermal conductivity may herein be electrically insulating, such as, for example, corresponding ceramics or a material filled with a corresponding ceramic, mica or heat-conducting pads.

This thermally conductive material may herein be considered to be part of the housing body or considered to be separate from the housing body. As a result of this, the embodiment explained above may be realized with a respective cavity, and the thermally conductive material is arranged in the cavity between the respective temperature sensor and the respective plate.

In a further embodiment, the housing also has a plurality of connecting pins, where the housing body has a plurality of recesses for receiving one of the connecting pins in each case. Two adjacent recesses have a same distance from one another in each case. The respective temperature sensor is arranged in one of the recesses and electrically connected to at least one of the connecting pins.

Herein, the respective recess may, for example, be embodied as the respective cavity explained above. Since two adjacent recesses have a same distance to one another in each case, the recesses may be arranged according to a grid. In one embodiment, the grid pitch is 2 mm to 5 mm (e.g., 3.8 mm), so that two adjacent recesses have a distance from one another corresponding to the grid pitch. The housing body may herein also have two or more rows of such recesses, where the grid pitch may be maintained within a respective row, but not necessarily from the edge of one row to the adjacent edge of the other row.

In each case, the respective recesses may all or only partially have a connecting pin arranged in the respective recess. The connecting pins may, for example, be used for contacting the respective plate (e.g., configured as a circuit carrier for a power module or for a processor), so that the supply voltage, grounding, and/or signal lines may be routed to the respective plate via the connecting pins. For example, the connecting pins may be integrated into the housing body, either inserted or glued into the recesses or encapsulated with plastic.

The respective temperature sensor is arranged in one of the recesses and electrically connected to the connecting pin arranged in the corresponding recess. This is particularly easy to realize for the embodiment explained above with a single-pole electrical line to the respective temperature sensor. The respective temperature sensor may be configured such that its one terminal embodies a connecting pin of the housing or housing body, and the respective temperature sensor is located in the housing body close to the connecting surface or the respective support point for the respective plate.

The explained embodiment of a grid-type housing body and the explained integration of the respective temperature sensor into this grid-type housing body represents a comparatively cost-effective variant since such housing bodies are produced in large numbers and are accordingly available in a simple and cost-effective manner.

For example, the respective temperature sensor may be introduced into the housing very cost-effectively using the same method as for the other connecting pins. For example, in the case of solder terminals, it is possible to directly use the terminal legs of wired temperature sensors. However, the terminals may also be provided with any other type of terminal (e.g., for press-fit technologies, ultrasonic or laser welding, spring contacts, or others).

In a further embodiment, the respective temperature sensor is configured in one piece with the at least one connecting pin. This may, for example, be achieved in that the respective temperature sensor already has at least one corresponding connecting pin that, in each case, is inserted into the corresponding recess(es) together with the other temperature sensor. This enables particularly cost-effective assembly and manufacture of the housing, and hence of the electrical appliance.

In a further embodiment, the respective plate is configured as a circuit carrier or as a heat sink.

A circuit carrier may, for example, be a direct bonded copper (DCB) substrate, an insulated metal substrate (IMS), or a baseplate on which a DCB substrate or an IMS is arranged. Herein, the baseplate may be metallic (e.g., made of copper) or an alloy.

Alternatively, the respective plate may be configured as a heat sink, which may have a rather flat upper side and a lower side with cooling fins or cooling pins arranged opposite this upper side.

In both embodiments, the respective plate may be thermally connected to the hottest point of the electrical appliance during operation, since the respective electrical component is connected to the respective plate.

Since the respective temperature sensor is very close to or in direct thermal contact on or with the respective plate or the respective electrical component, the temperature of the respective electrical component may hence be determined reliably and accurately.

In a further embodiment, the respective electrical component has at least one power module arranged on the respective plate or including the respective plate. In one embodiment, the respective plate is herein configured as a circuit carrier. In one embodiment, the respective power module includes one or more power components, such as, for example, power diodes, thyristors, triacs, and transistors, such as, for example, power MOSFETs, IGBTs and the like. Further, an electrical resistor (e.g., a measuring resistor) may be used as a power component.

In a further embodiment, the respective electrical component has at least one processor arranged on the respective plate or including the respective plate. In one embodiment, the respective plate is herein configured as a circuit carrier. The processor may, for example, be configured as a central processing unit (CPU) or a graphics processing unit (GPU) of the electrical appliance and herein in each case have one or more processor cores.

In a further embodiment, the respective temperature sensor is supported on the respective plate, and/or a material with good thermal conductivity is arranged between the respective temperature sensor and the respective plate.

Herein, a good heat conductor is considered to be a material with a thermal conductivity of at least 40 W/(m·K) (e.g., greater than 200 W/(m·K) or 400 W/(m·K)). This embodiment achieves particularly good thermal contact between the respective temperature sensor and the respective plate, as already explained above.

In a further embodiment, the electrical appliance is configured as a power converter, controller, computer, smartphone, or appliance for consumer electronics, building automation or smart home, or as a household appliance. Power converters and controllers are herein primarily used in industrial environments (e.g., in production and automation). Power converters are also used in electric vehicles (e.g., electric cars, electric buses, electrically powered trains, and the like) or in energy conversion and distribution. Herein, computers may include personal computers, laptops, pads, and the like.

DETAILED DESCRIPTION

Figure 1:
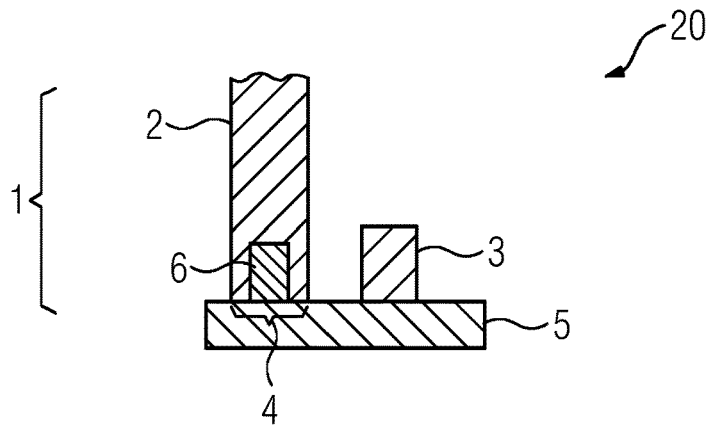
FIGS. 1-3 show examples of a housing and an appliance.

FIG. 1 shows a first example of a housing 1 and an appliance 20, where a cross section through a section of the housing 1 and the appliance 20 is depicted. The housing 1 has a housing body 2 that partially houses an electrical component 3 of an electrical appliance 20, where the electrical component 3 is connected to a plate 5 of the electrical appliance 20. The housing body 2 has a support point 4 for being supported on the plate 5, where, in the context of the example, the support point 4 is a supporting surface.

The housing 1 also has a temperature sensor 6 for sensing the temperature of the plate 5. Herein, the temperature sensor 6 is arranged in the housing body 2 in a region of the support point 4.

The electrical component 3 and the plate 5 are not part of the housing 1, but are part of the electrical appliance 20.

As indicated in FIG. 1, the temperature sensor 6 may lie on or touch the plate 5.

Figure 2:
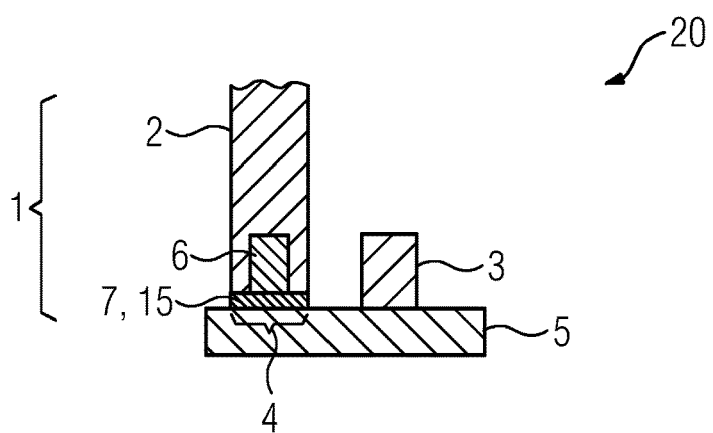

FIG. 2 shows a second example of an appliance 20, where, once again, a cross section through a section of the housing 1 and the appliance 20 is depicted. Herein, the same reference symbols as used in FIG. 1 designate the same objects.

The housing body 2 has an electrically insulating material 7 in a region of the respective support point 4. Alternatively or additionally, a material with good thermal conductivity 15 may be arranged in the region of the respective support point 4, which may be part of the housing body 2. If the electrical insulating material 7 or the material 15 with good thermal conductivity is part of the housing body 2, the temperature sensor is completely enclosed by the housing body 2.

In an embodiment, the material arranged in the region of the respective support point 4 between the temperature sensor 6 and the plate 5 is electrically insulating and also has good thermal conductivity.

Figure 3:
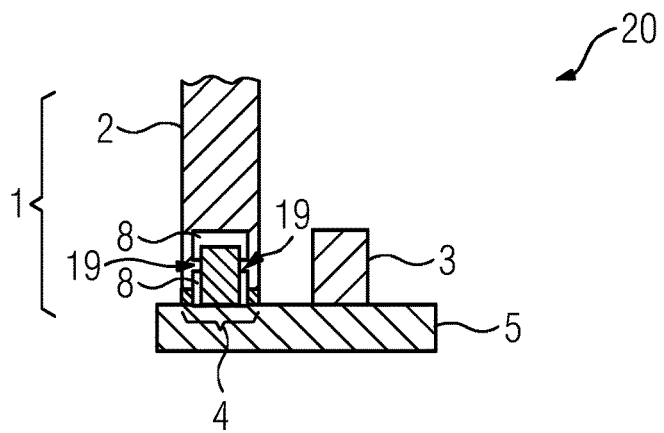

FIG. 3 shows a third example of a housing 1 and an appliance 20, where, once again, a cross section through a section of the housing 1 and the appliance 20 is depicted.

The housing body 2 has a cavity 8 in which the temperature sensor 6 is arranged. Herein, the housing body 2 has two projections 19 in the cavity 8 that fix the temperature sensor 6.

Figure 4:
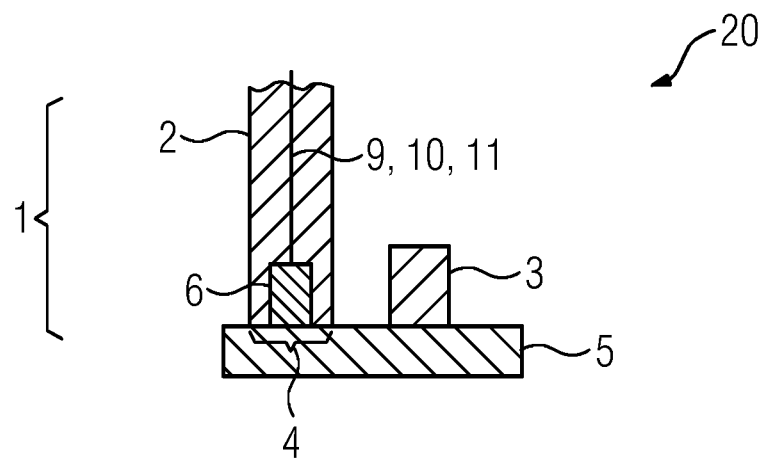
FIGS. 4 and 5 show first and second embodiments of the housing and the appliance, respectively.

FIG. 4 shows a first exemplary embodiment of the housing 1 and the appliance 20, where, once again, a cross section through a section of the housing 1 and the appliance 20 is depicted.

The housing body 2 has an electrical line to the temperature sensor 6, where the electrical line is configured as a single-pole electrical line 9. In other examples, the electrical line may be configured as a two-pole electrical line 10 or three-pole electrical line 11.

In the single-pole variant, the single-pole electrical line 9 provides the first terminal line for the temperature sensor 6, where the second terminal line is implemented via an electrical contact of the temperature sensor 6 with the plate 5, the plate 5 and possibly a grounding or another line, connected to the plate 5.

In the two-pole variant, according to a first subvariant, the two-pole electrical line 10 provides two signal lines of the temperature sensor 6. This subvariant may be advantageous if the temperature sensor 6 is electrically separated or insulated from the plate 5. According to a second subvariant, the two-pole electrical line 10 may have one of the two signal lines and a line for the voltage supply of the temperature sensor 6. In this second subvariant, the temperature sensor 6 may be in electrical contact with the plate 5, so that the second terminal line is implemented via the electrical contact of the temperature sensor 6 with the plate 5, the plate 5 and possibly a grounding or other line, connected to the respective plate.

In the three-pole variant, the three-pole electrical line 11 provides two lines for the signal lines and a line for the supply voltage of the temperature sensor 6. This may be advantageous if the temperature sensor 6 is electrically separated or insulated from the plate 5.

Figure 5:
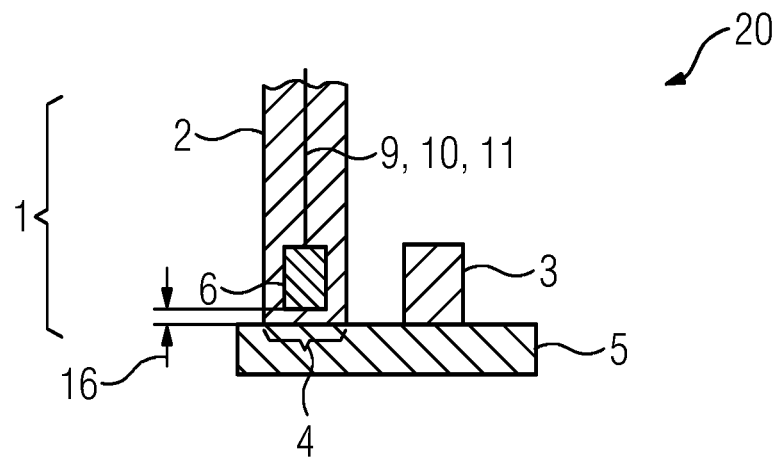

FIG. 5 shows a second exemplary embodiment of the housing 1 and the appliance 20, where a cross section through a section of the housing 1 and the appliance 20 is depicted.

The second exemplary embodiment herein represents an alternative to the first exemplary embodiment. The temperature sensor 6 is completely enclosed by the housing body 2, where the housing body 2 in each case has a single-pole electrical line 9 to the respective temperature sensor 6. In other examples, the electrical line may be configured as a two-pole electrical line 10 or a three-pole electrical line 11.

In the single-pole variant, the single-pole electrical line 9 provides the first terminal line for the temperature sensor 6, where the second terminal line is implemented via an electrical contact of the temperature sensor 6 with the plate 5, the plate 5 and possibly a grounding or other line connected to the respective plate. For this purpose, the housing body 2 has an electrically conductive material between the temperature sensor 6 and the supporting surface 4 or the plate 5.

In the second subvariant of the two-pole variant, the two-pole electrical line 10 provides one of the two signal lines and a line for the voltage supply for the temperature sensor 6. The temperature sensor 6 is in electrical contact with the plate 5, so that the second terminal line is implemented via the electrical contact of the temperature sensor 6 with the plate 5, the plate 5 and possibly a grounding or other line connected to the respective plate. For this purpose, the housing body 2 has an electrically conductive material between the temperature sensor 6 and the supporting surface 4 or the plate 5.

The housing body 2 has only a small thickness 16 between the temperature sensor 6 and the support point 4. This may, for example, be the case if the housing body 2 has a size in the range of centimeters or decimeters and the thickness 16 is in the range of millimeters (e.g., a few millimeters, a few tenths or hundredths of a millimeter).

Figure 6:
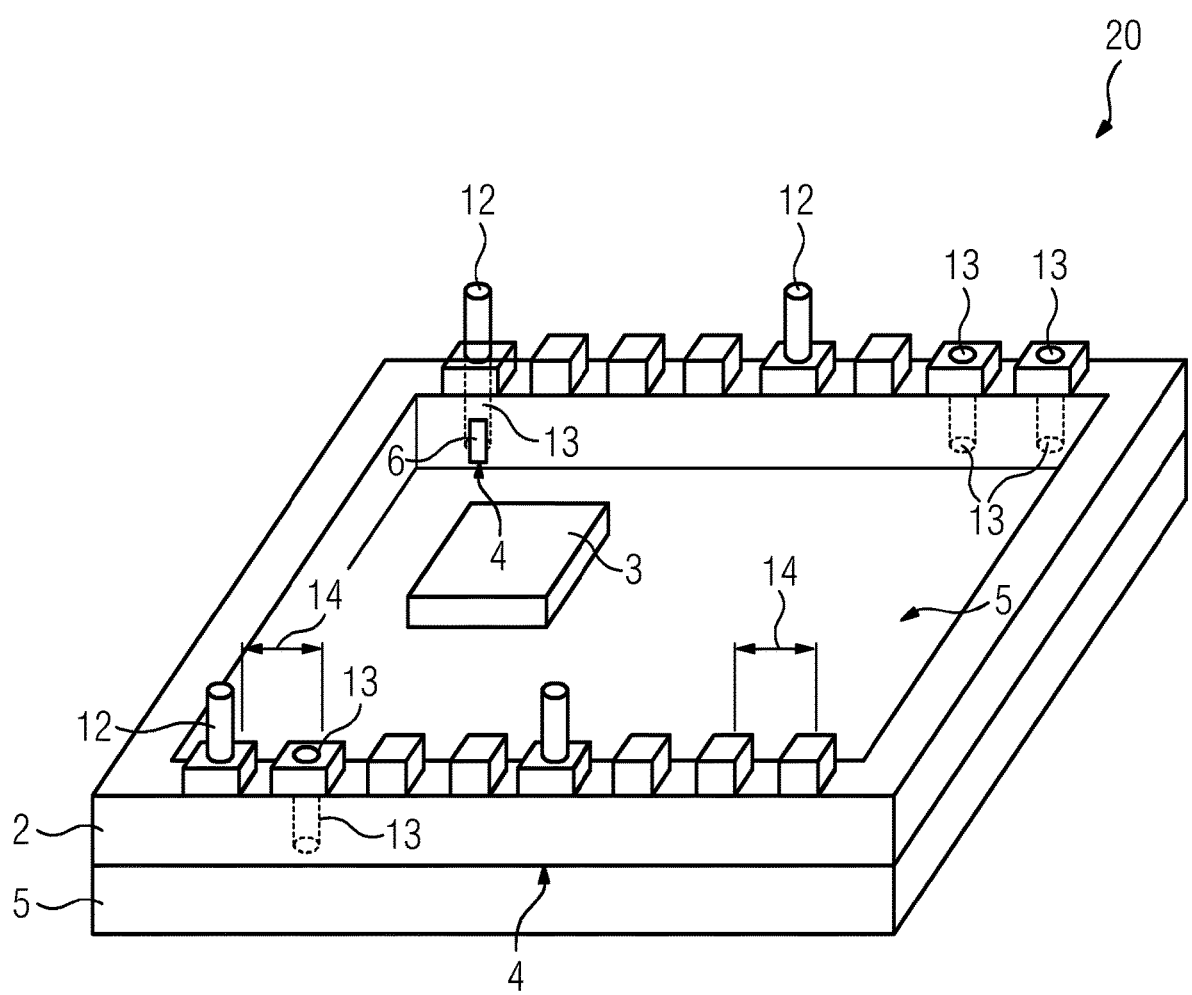
FIG. 6 shows a further exemplary embodiment of the electrical appliance.

FIG. 6 shows a further exemplary embodiment of the electrical appliance 20 in a perspective view.

The housing body 2 is configured as a housing frame in the shape of a rectangular ring. Herein, the housing body 2 is arranged on the plate 5 or fastened thereto so that the housing body 2 is supported over a large area on the plate 5 at a support point 4 implemented as a supporting surface. The plate 5 and the housing body 2 together have the shape of a flat shell in which the electrical component 3 is arranged. Herein, the electrical component 3 is likewise arranged on the plate 5 or fastened thereto and is surrounded by the housing body 2.

The housing body 2 has a plurality of recesses 13 in which a connecting pin 12 may be inserted in each case. Herein, two adjacent recesses 13 have a same distance from one another 14. This arrangement of the recesses 13 according to a grid is maintained within the two rows of recesses 13 depicted, but not between pairs of recesses 13 in which one recess 13 belongs to one row and the other recess 13 belongs to the other row.

The temperature sensor 6 is arranged in one of the recesses 13 and electrically connected to the connecting pin 12 arranged in these recesses 13. For this purpose, the housing body 2 in each case has a single-pole electrical line 9 (not depicted) to the respective temperature sensor 6. In one embodiment, the temperature sensor 6 is configured in one piece with this connecting pin 12, so that the connecting pin 12 embodies this single-pole electrical line 9.

Herein, the recesses 12 may, for example, be embodied like the cavities 8 explained above and, for example, have projections 19 for fixing the respective temperature sensors 6.

While the present disclosure has been described in detail with reference to certain embodiments, the present disclosure is not limited to those embodiments. In view of the present disclosure, many modifications and variations would present themselves, to those skilled in the art without departing from the scope of the various embodiments of the present disclosure, as described herein. The scope of the present disclosure is, therefore, indicated by the following claims rather than by the foregoing description. All changes, modifications, and variations coming within the meaning and range of equivalency of the claims are to be considered within the scope.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

The invention claimed is:

1. A housing for an electrical appliance, the housing comprising:
   a housing body that at least partially houses a respective electrical component of the electrical appliance, wherein the housing body has at least one support point for being supported on a respective plate to which the respective electrical component is connected; and
   at least one temperature sensor configured to sense a temperature of the respective plate, wherein a respective temperature sensor of the at least one temperature sensor in the housing body is arranged in a region of a respective support point of the at least one support point,
   wherein the housing body has a single-pole electrical line to the respective temperature sensor.

2. The housing of claim 1, wherein the housing body has an electrically insulating material.

3. The housing of claim 2, wherein the housing body has the electrically insulating material at least in the region of the respective support point.

4. The housing of claim 2, wherein the respective temperature sensor is arranged in a respective cavity of the housing body.

5. The housing of claim 4, wherein the housing body has at least two projections in the respective cavity for fixing the respective temperature sensor.

6. The housing of claim 5, wherein the respective temperature sensor is completely enclosed by the housing body.

7. The housing of claim 6, further comprising a plurality of connecting pins,
   wherein the housing body has a plurality of recesses for receiving the plurality of connecting pins, respectively
   wherein in each case, two adjacent recesses of the plurality of recesses have a same distance to one another, and
   wherein the respective temperature sensor is arranged in one recess of the plurality of recesses and is electrically connected to at least one connecting pin of the plurality of connecting pins.

8. The housing of claim 7, wherein the respective temperature sensor is configured in one piece with the at least one connecting pin.

9. The housing of claim 1, wherein the respective temperature sensor is arranged in a respective cavity of the housing body.

10. The housing of claim 9, wherein the housing body has at least two projections in the respective cavity for fixing the respective temperature sensor.

11. The of claim 1, wherein the respective temperature sensor is completely enclosed by the housing body.

12. The housing of claim 1, further comprising a plurality of connecting pins,
   wherein the housing body has a plurality of recesses for receiving the plurality of connecting pins, respectively,
   wherein in each case, two adjacent recesses of the plurality of recesses have a same distance to one another, and
   wherein the respective temperature sensor is arranged in one recess of the plurality of recesses and is electrically connected to at least one connecting pin of the plurality of connecting pins.

13. The housing of claim 12, wherein the respective temperature sensor is configured in one piece with the at least one connecting pin.

14. An electrical appliance comprising:
   at least one electrical component;
   at least one plate connected to the at least one electrical component, respectively; and
   at least one housing, a housing of the at least one housing comprising:
      a housing body that at least partially houses a respective electrical component of the electrical appliance, wherein the housing body has at least one support point for being supported on a respective plate to which the respective electrical component is connected; and
      at least one temperature sensor configured to sense a temperature of the respective plate, wherein a respective temperature sensor of the at least one temperature sensor in the housing body is arranged in a region of a respective support point of the at least one support point,
   wherein the housing body is supported on the respective plate at the respective support point, and
   wherein the housing body has a single-pole electrical line to the respective temperature sensor.

15. The electrical appliance of claim 14, wherein the respective plate is configured as a circuit carrier or as a heat sink.

16. The electrical appliance of claim 14, wherein the respective electrical component comprises at least one power module arranged on the respective plate or comprising the respective plate.

17. The electrical appliance of claim 14, wherein the respective electrical component has at least one processor arranged on the respective plate or comprising the respective plate.

18. The electrical appliance of claim 14, wherein:
the respective temperature sensor is supported on the respective plate;
a material with good thermal conductivity is arranged between the respective temperature sensor and the respective plate; or
a combination thereof.

19. The electrical appliance of claim 14, wherein the electrical appliance is configured as a power converter, a controller, a computer, a smartphone, or an appliance for consumer electronics, building automation, or a smart home, or as a household appliance.

* * * * *